US012770660B2

(12) United States Patent
Ato

(10) Patent No.: US 12,770,660 B2
(45) Date of Patent: Oct. 20, 2026

(54) APPARATUSES AND METHODS INCLUDING CIRCUITS IN GAP REGIONS OF A MEMORY ARRAY

(71) Applicant: MICRON TECHNOLOGY, INC., Boise, ID (US)

(72) Inventor: Hirokazu Ato, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 280 days.

(21) Appl. No.: 18/481,855

(22) Filed: Oct. 5, 2023

(65) Prior Publication Data

US 2024/0177744 A1 May 30, 2024

Related U.S. Application Data

(60) Provisional application No. 63/428,660, filed on Nov. 29, 2022.

(51) Int. Cl.
*G11C 7/08* (2006.01)
*G11C 7/02* (2006.01)
*G11C 7/10* (2006.01)

(52) U.S. Cl.
CPC .................. *G11C 7/08* (2013.01); *G11C 7/02* (2013.01); *G11C 7/1048* (2013.01)

(58) Field of Classification Search
CPC ........... G11C 7/08; G11C 7/02; G11C 7/1048; G11C 5/025; G11C 7/06; G11C 7/10; G11C 7/1096; G11C 7/12
USPC .......................................................... 365/207
See application file for complete search history.

(56) References Cited

U.S. PATENT DOCUMENTS 7,016,236 B2 * 3/2006 Kajigaya ................. H01L 24/06 438/587
2006/0023536 A1 * 2/2006 Cho .................... G11C 11/4091 365/207
2011/0026337 A1 * 2/2011 Kwack ..................... G11C 7/18 365/230.03

* cited by examiner

*Primary Examiner* — Huan Hoang
(74) *Attorney, Agent, or Firm* — Dorsey & Whitney LLP

(57) ABSTRACT

Apparatuses and methods including circuits in gap regions of a memory array are disclosed. An example apparatus includes first and second memory mats adjacent along a first direction, and further includes a region between the first and second memory mats along the first direction. The region includes a local input/output (LIO) line that extends along a second direction perpendicular to the first direction through the region, and further includes a LIO driver and a LIO precharge circuit coupled to the LIO line. The LIO driver is configured to drive the LIO line to data voltage levels based on data read from memory cells or based on data to be written to memory cells, and the LIO precharge circuit is configured to provide a LIO precharge voltage to the LIO lines.

20 Claims, 6 Drawing Sheets

APPARATUSES AND METHODS INCLUDING CIRCUITS IN GAP REGIONS OF A MEMORY ARRAY

CROSS-REFERENCE TO RELATED APPLICATION

This application claims the filing benefit of U.S. Provisional Application No. 63/428,660, filed Nov. 29, 2022. This application is incorporated by reference herein in its entirety and for all purposes.

BACKGROUND

During memory access operations in a semiconductor memory device, noise generated by activated circuits can interfere with operations. Internal signal levels have decreased due to circuit density and a desire to reduce power consumption. As a result of the lower signal levels, noise may be relatively more impactful on the integrity of the internal signals. In some operations, errors may occur when the effect of noise is significant. For example, noise generated during sense amplifier operations may cause incorrect data to be amplified by the sense amplifiers and result in providing erroneous read data. Thus, mitigating the effect and generation of noise is desirable.

DETAILED DESCRIPTION

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring embodiments of the disclosure. Additionally, terms such as “couples” and “coupled” mean that two components may be directly or indirectly electrically coupled. Indirectly coupled may imply that two components are coupled through one or more intermediate components.

Figure 1:
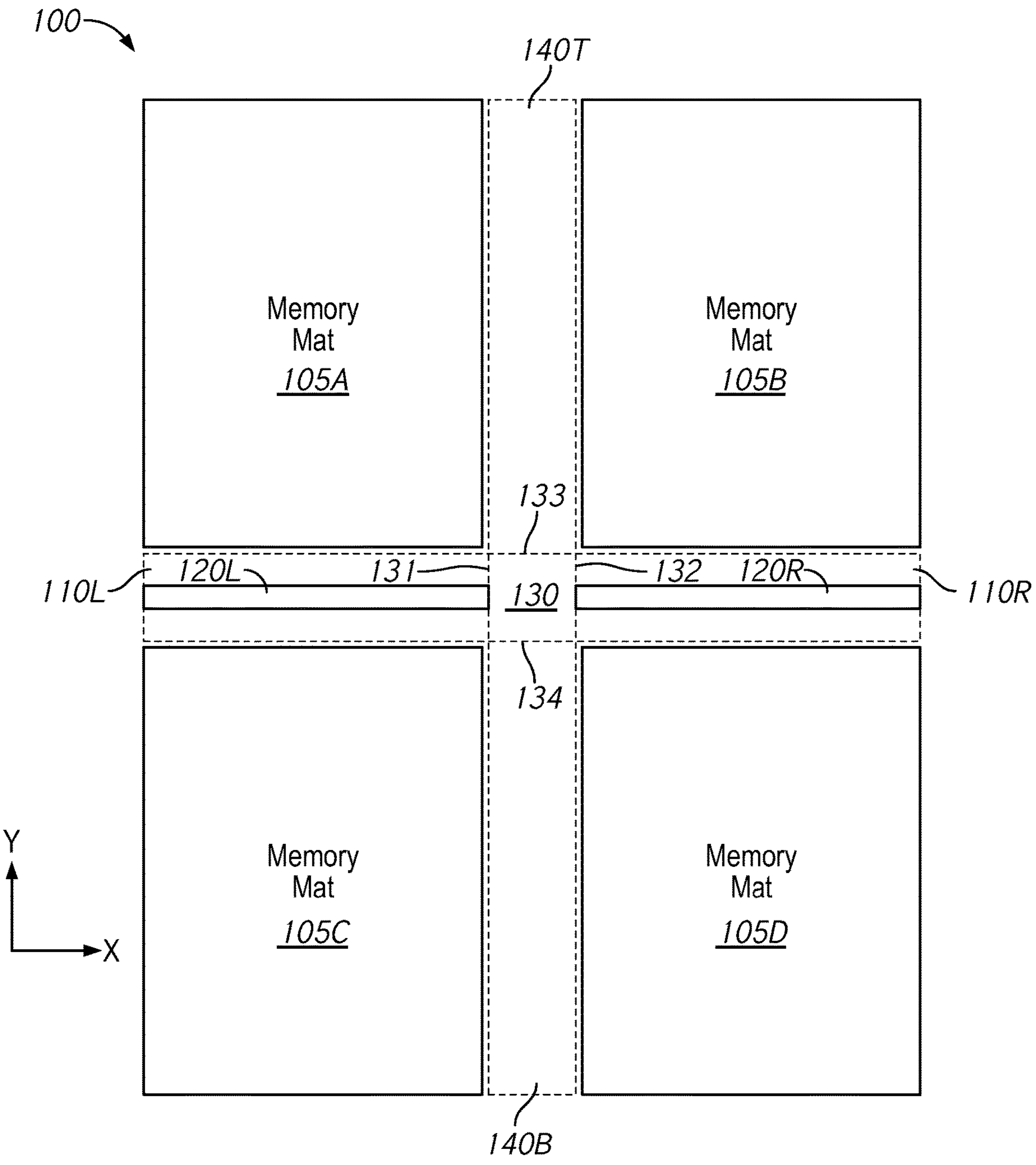
FIG. 1 is a block diagram of a portion of a memory array according to an embodiment of the disclosure.

FIG. 1 is a block diagram of a portion of a memory array 100 according to an embodiment of the disclosure. The memory array 100 includes memory mats 105A-105D and “gap regions” between the memory mats 105. The memory mats 105 include memory cells coupled to word lines and digit lines, with memory cells at the intersections of the word and digit lines. The memory mats 105A and 105B are adjacent along a direction X, and the memory mats 105C and 105D are adjacent along the direction X. The memory mats 105A and 105C are adjacent along a direction Y, and the memory mats 105B and 105D are adjacent along the direction Y.

The gap regions include sense amplifier gap region 110L between memory mats 105A and 105C along direction Y, and include sense amplifier gap region 110R between memory mats 105B and 105D along direction Y. The sense amplifier gap regions 110L and 110R include sense amplifier (SA) regions having sense amplifiers that are coupled to digit lines of the memory mats 105A and 105C, and to digit lines of the memory mats 105B and 105D, respectively. The sense amplifier gap regions 110L and 110R also each include one or more local input/output (LIO) lines that extend in the sense amplifier gap regions along a direction X. The LIO line of 110L is coupled to the digit lines of the memory mats 105A and 105C to provide data to and from the memory cells, and the LIO line of 110R is coupled to the digit lines of the memory mats 105B and 105D to provide data to and from the memory cells. The sense amplifier gap regions 110L and 110R also include read-write gap regions 120L and 120R, respectively. The read-write gap regions 120L and 120R include circuits for accessing memory cells of the memory mats 105, for example, LIO drivers and LIO precharge circuits coupled to the LIO lines, as will be described in more detail below.

The gap regions further include word driver gap region 140T between memory mats 105A and 105B along direction X, and further include word driver gap region 140B between memory mats 105C and 105D along direction X. The word driver gap regions 140T and 140B may include sub-word line driver circuits coupled to word lines of the memory mats 105A and 105B, and the memory mats 105C and 105D, respectively.

The gap regions also include a minigap region 130 that is adjacent the sense amplifier region 110L along the direction X and also adjacent the sense amplifier region 110R along the direction X. The minigap region 130 has a corner at a corner of the memory mat 105A and has another corner at a corner of the memory mat 105C. The minigap region 130 further has a corner at a corner of the memory mat 105B and has another corner at a corner of the memory mat 105D. The minigap region 130 shares a boundary 131 with the sense amplifier region 110L. The minigap region 130 shares another boundary 132 with the sense amplifier region 110R. The minigap region 130 shares a boundary 133 with the word driver gap region 140T and shares another boundary 134 with the word driver gap region 140B. In some embodiments of the disclosure, the minigap region 130 is at an intersection of the sense amplifier gap regions 110L and 110R, and word driver gap regions 140T and 140B.

The minigap region 130 may include circuits that provide an activation voltage to circuits in the sense amplifier gap regions. For example, in some embodiments of the disclosure, the minigap region 130 includes activation voltage drivers that provide an activation voltage to sense amplifiers in the sense amplifier gap regions 110L and 110R.

A conductive supply voltage mesh coupled to activation voltage drivers may also be included in the gap regions. The conductive supply voltage mesh include conductive signal lines on which the activation voltage is provided from activation voltage drivers in the minigap region 130 to the circuits in the sense amplifier gap regions 110L and 110R, such as the sense amplifiers. In this manner, the activation voltage may be distributed from the minigap region 130 to the circuits in the sense amplifier gap regions 110L and 110R.

Figure 2:
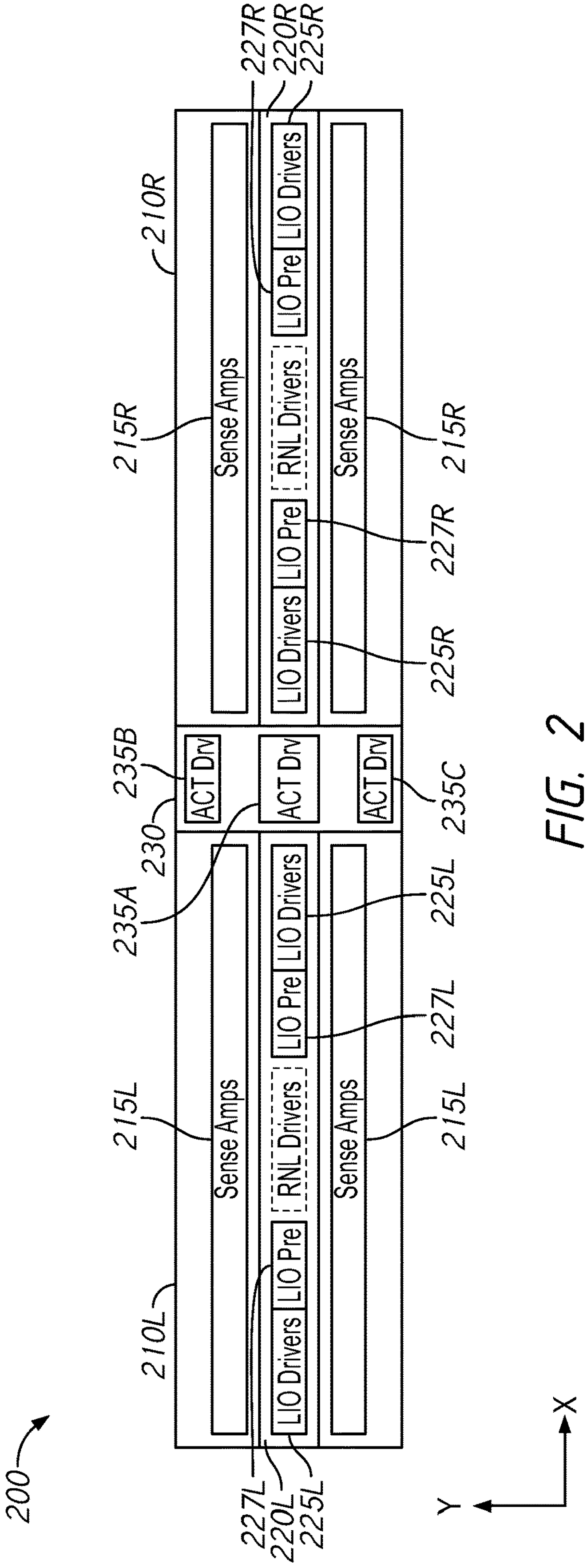
FIG. 2 is a block diagram of a portion of gap regions of between memory mats according to an embodiment of the disclosure.

FIG. 2 is a block diagram of a portion 200 of gap regions of between memory mats according to an embodiment of the disclosure. The portion 200 of the gap regions may be included in gap regions of FIG. 1 in some embodiments of the disclosure.

The portion 200 of the gap regions includes sense amplifier gap regions 210L and 210R, and a minigap region 230 between the sense amplifier gap regions 210L and 210R in a direction X. The sense amplifier gap regions 210L and 210R include sense amplifiers in the SA regions 215L and 215R, and further include read-write gap regions 220L and 220R, all respectively. The read-write gap regions 220L and 220R extend in the direction X. The SA regions 215L are adjacent the read-write gap region 220L in a direction Y and on opposite sides of the read-write gap region 220L. The SA regions 215R are adjacent the read-write gap region 220R in the direction Y and on opposite sides of the read-write gap region 220R. The read-write gap region 220L includes local input/output (LIO) line drivers 225L and LIO precharge circuits 227L. The LIO drivers 225L and the LIO precharge circuits 227L are between the SA regions 215L in the direction Y. The read-write gap region 220R includes LIO drivers 225R and LIO precharge circuits 227R. The LIO drivers 225R and the LIO precharge circuits 227R are between the SA regions 215R in the direction Y.

In some embodiments of the disclosure, sense amplifier low activation voltage driver circuits (RNL drivers) are also included in the read-write gap regions 220L and 220R. The RNL drivers may provide a low level activation voltage (e.g., ground) to the sense amplifiers in the SA regions 215L and 215R.

The sense amplifiers in the SA regions 215L are coupled to digit lines that extend through the array region in the direction Y, and are activated during memory array access operations to read data from and write data to the memory cells of the memory array. Data read from the memory cells are provided by the sense amplifiers to one or more local input/output lines that extend in the direction X in the sense amplifier gap regions 210, and data written to the memory cells are provided by the sense amplifiers from the local input/output lines. In some embodiments of the disclosure, the sense amplifiers are threshold voltage compensated sense amplifiers. Threshold voltage compensated sense amplifiers establish a compensation voltage during a compensation phase prior to sensing data states of the memory cells to compensate for transistor threshold voltage mismatch.

The LIO drivers 225 are coupled to the local input/output lines and drive the local input/output lines to data voltage levels based on the data read from the memory cells by the sense amplifiers or based on the data to be written to the memory cells. In some embodiments, the LIO drivers 225 are coupled to complementary pairs of local input/output lines where differential data signals are used. In other embodiments, the LIO drivers 225 are coupled to single-ended local input/output lines where single-ended data signals are used. The LIO precharge circuits 227 are coupled to the LIO drivers 225 and/or local input/output lines and provide a LIO precharge voltage to the local input/output lines following memory array access operations. In some embodiments, the LIO precharge circuits 227 provide a high level precharge voltage (e.g., equal to or greater than 1.0 volts) as the LIO precharge voltage to the local input/output lines. In other embodiments, the LIO precharge circuits 227 provide a low level precharge voltage (e.g., ground) as the LIO precharge voltage to the local input/output lines.

In some embodiments, as shown in the example of FIG. 2, the minigap region 230 generally extends in the direction Y, with a dimension of the minigap region 230 in the direction Y greater than a dimension of the minigap region 230 in the direction X. In other embodiments, the dimension in the direction X for the minigap region is greater than the dimension in the direction Y. The minigap region 230 includes one or more activation voltage driver circuits, for example, ACT driver circuits 235A-235C. The ACT driver circuits 235 provide a high level activation voltage (e.g., equal to or greater than 1.0 volts) to the sense amplifiers in the SA regions 215L and 215R during a memory access operation.

In some embodiments of the disclosure, the ACT driver circuits 235A-235C provide a same high level activation voltage, but with different current drives. For example, the ACT driver circuit 235A provides the high level activation voltage with a first current drive, the ACT driver circuit 235B provides the high level activation voltage with a second current drive that is different than the first current drive, and the ACT driver circuit 235C provides the high level activation voltage with a third current drive that is different from at least one of the first and second current drives. In some embodiments of the disclosure, one or more of the ACT driver circuits 235A-235C provide a different high level activation voltage from the other ACT driver circuits. For example, one of the ACT driver circuits 235A-235C may provide a first high level activation voltage, and another one of the ACT driver circuits 235A-235C may provide a second high level activation voltage that is a lower voltage than the first high level activation voltage. The different high level activation voltages may be provided at different times during a memory access operation.

With the LIO precharge circuits included in the read-write gap region of the sense amplifier gap regions, circuits, such as ACT voltage drivers may be included in the minigap region. The LIO precharge circuits in the read-write gap regions are closer to the LIO drivers and the LIO lines. Additionally, noise affecting sensing operations of the memory cells that is caused by the ACT voltage transitioning to full voltage may be reduced by having the ACT voltage drivers in the minigap region (which results from having the LIO precharge circuits in the read-write gap regions) compared to having the ACT voltage drivers in the read-write region.

Figure 3:
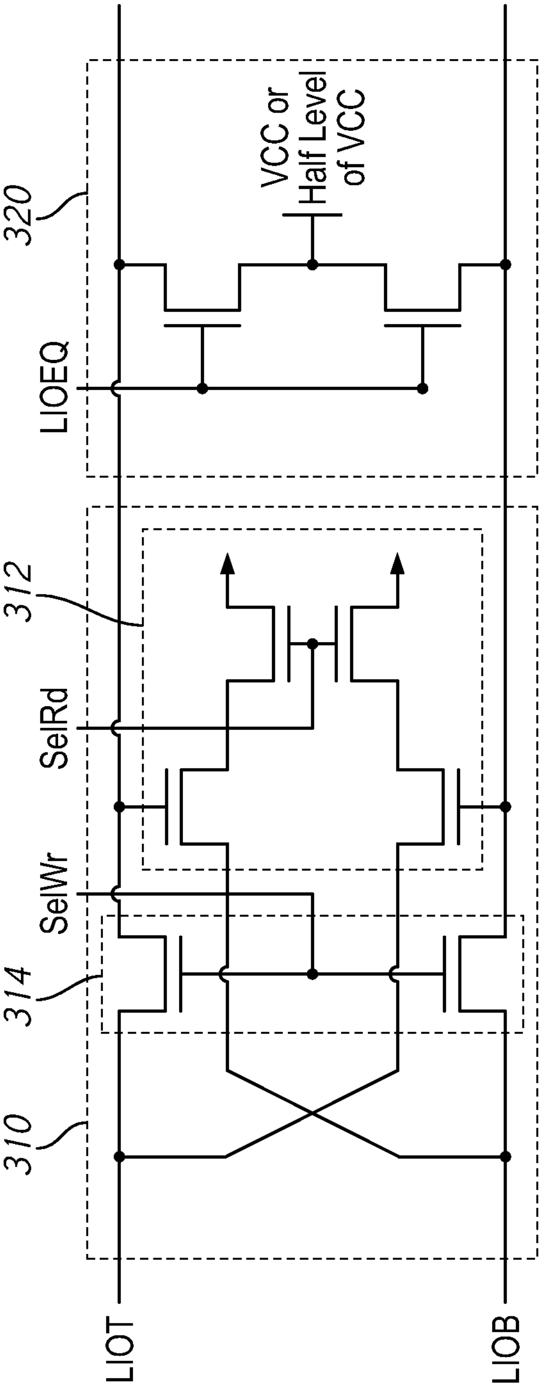
FIG. 3 is a schematic diagram of a local input/output (LIO) line driver and an LIO precharge circuit according to some embodiments of the disclosure.

FIG. 3 is a schematic diagram of a local input/output (LIO) line driver 310 and an LIO precharge circuit 320 according to some embodiments of the disclosure. The LIO driver 310 and the LIO precharge circuit 320 are coupled to LIO lines LIOT and LIOB, for example, that extend through sense amplifier gap regions (e.g., sense amplifier gap regions 210 of FIG. 2). In some embodiments of the disclosure, the LIO drivers 225 and the LIO precharge circuits 227 of FIG. 2 include the LIO driver 310 and the LIO precharge circuit 320, respectively.

The LIO driver 310 includes a read circuit 312 and a write circuit 314. The read circuit 312 is enabled by an active read selection signal SelRd (e.g., active high logic level) and drives one of the LIO lines LIOT or LIOB to ground based on a logic level of the opposite LIO line, LIOB and LIOT, respectively. The write circuit 314 is enabled by an active write selection signal SelWr (e.g., active high logic level) and provides logic levels of the LIO lines LIOT and LIOB to the digit lines to write data to memory. The LIO precharge circuit 320 is enabled by an active LIO precharge signal LIOEQ (e.g., active high logic level) to provide a LIO precharge voltage to the LIO lines LIOT and LIOB following a memory array access operation. Following a precharge operation, the LIO lines LIOT and LIOB are precharged to the LIO precharge voltage, such as VCC (e.g., 1.05V) or a half level of VCC (e.g., 0.48V).

Figure 4:
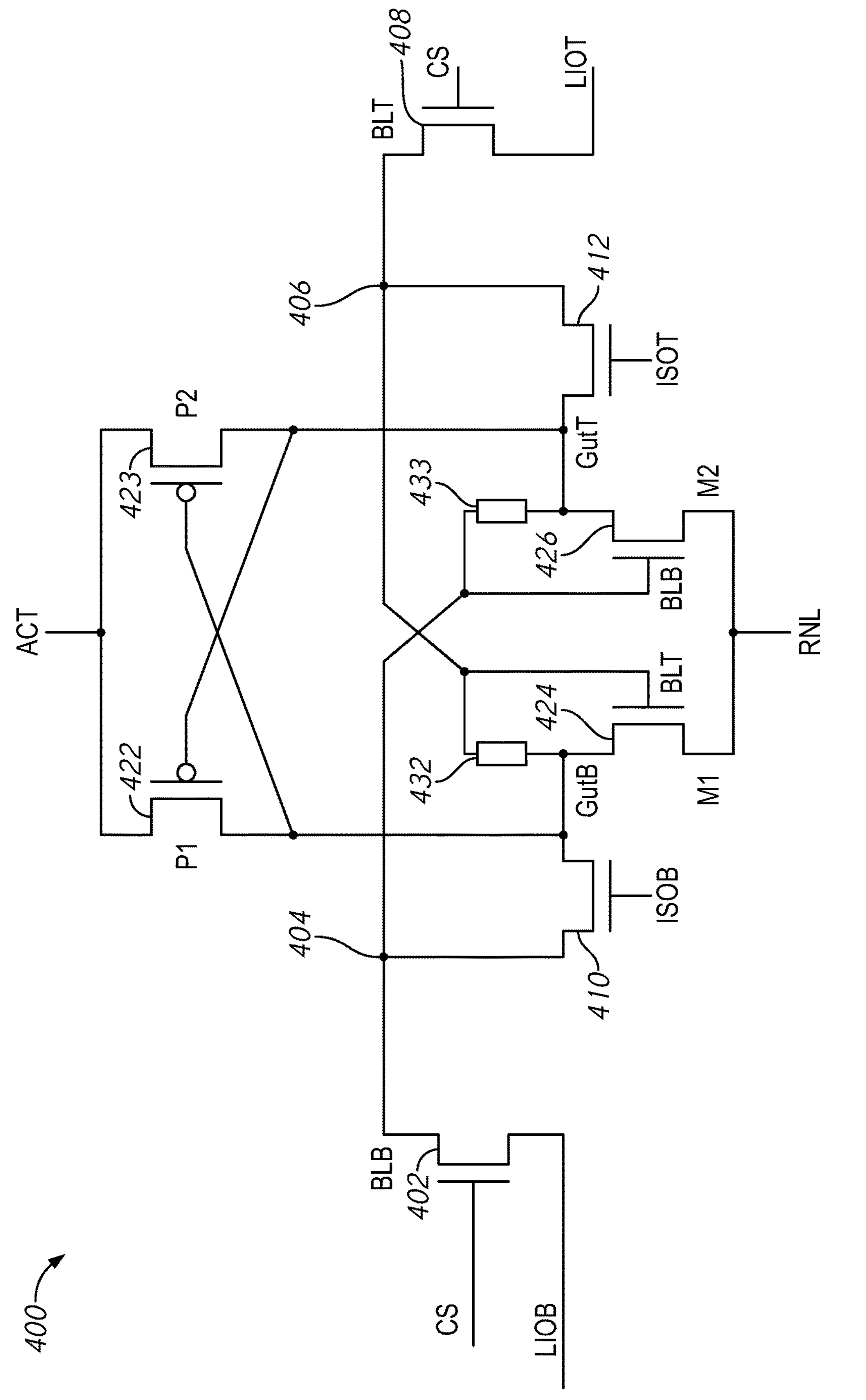
FIG. 4 is a schematic diagram of a sense amplifier according to an embodiment of the disclosure.

FIG. 4 is a schematic diagram of a sense amplifier 400 according to an embodiment of the disclosure. The sense amplifier 400 may, in some embodiments, be included in the sense amplifier gap regions 110 of FIG. 1 and/or the sense amplifier regions 215 of FIG. 2.

The sense amplifier 400 selectively amplifies a signal on the digit lines BLB and BLT. A column switch 402 is coupled to the digit line BLB and to a local input/output line LIOT, and a column switch 408 is coupled to the digit line BLT and to a local input/output line LIOB. When the column switches 402 and 408 are activated by an active control signal CS (e.g., CS active high logic level), voltages are provided from the digit lines BLB and BLT to the local input/output lines LIOB and LIOT, respectively, or vice versa.

The sense amplifier 400 includes a pair of isolation transistors 410 and 412. These isolation transistors 410 and 412 may be coupled to respective isolation signals ISOB and ISOT respectively. The sense amplifier 400 includes p-type transistors P1 422 and P2 423 and n-type transistors M1 424 and M2 426. The transistor P1 422 has a node that is provided an activation voltage ACT, a node coupled to a node GutB, and a gate coupled to a node GutT. The node GutB may be coupled through a transistor 432 to the bit line BLT, and the node GutT may be coupled through a transistor 433 to the bit line BLB. The transistor P2 423 has a node that is provided the activation voltage ACT, a node coupled to node GutT, and a gate coupled to node GutB. The transistor M1 has a node coupled to the node GutB, a node that is provided an activation voltage RNL, and a gate coupled to the bit line BLT. The transistor M2 has a node coupled to the node GutT, a node that is provided the activation voltage RNL, and a gate coupled to the bit line BLB. During access operations, the activation voltages ACT and RNL may be provided to activate the sense amplifier 400.

A first isolation transistor 410 is coupled between the bit line BLB and the node GutB. The first isolation transistor 410 has a gate coupled to a signal ISOB. The first isolation transistor 410 may act as a switch and may couple the bit line BLB to the node GutB when the signal ISOB is active. The first isolation transistor 410 may be an n-type transistor which is active when the signal ISOB is at a logical high. The sense amplifier also includes a second isolation transistor 412, analogous to the first isolation transistor 410. The second isolation transistor 412 is coupled between the bit line BLT and the node GutT, with a gate coupled to a signal ISOT. When the signal ISOT is active, the second isolation transistor 412 couples the bit line BLB 406 to the gut node GutT.

In operation, a charge state of an activated memory cell is provided to the sense amplifier 400, and when the sense amplifier 400 is activated by providing the activation voltages ACT and RNL, the charge state is amplified, resulting in one of the digit lines BLB or BLT being driven to the activation voltage ACT and the other digit line being driven to the activation voltage RNL. The amplified charge state may be provided as read data over the local input/output lines LIOB and LIOT when the column switches 402 and 408 are activated, or new data provided on the local input/output lines LIOB and LIOT may be written to the activated memory cell through the sense amplifier 400.

Figure 5:
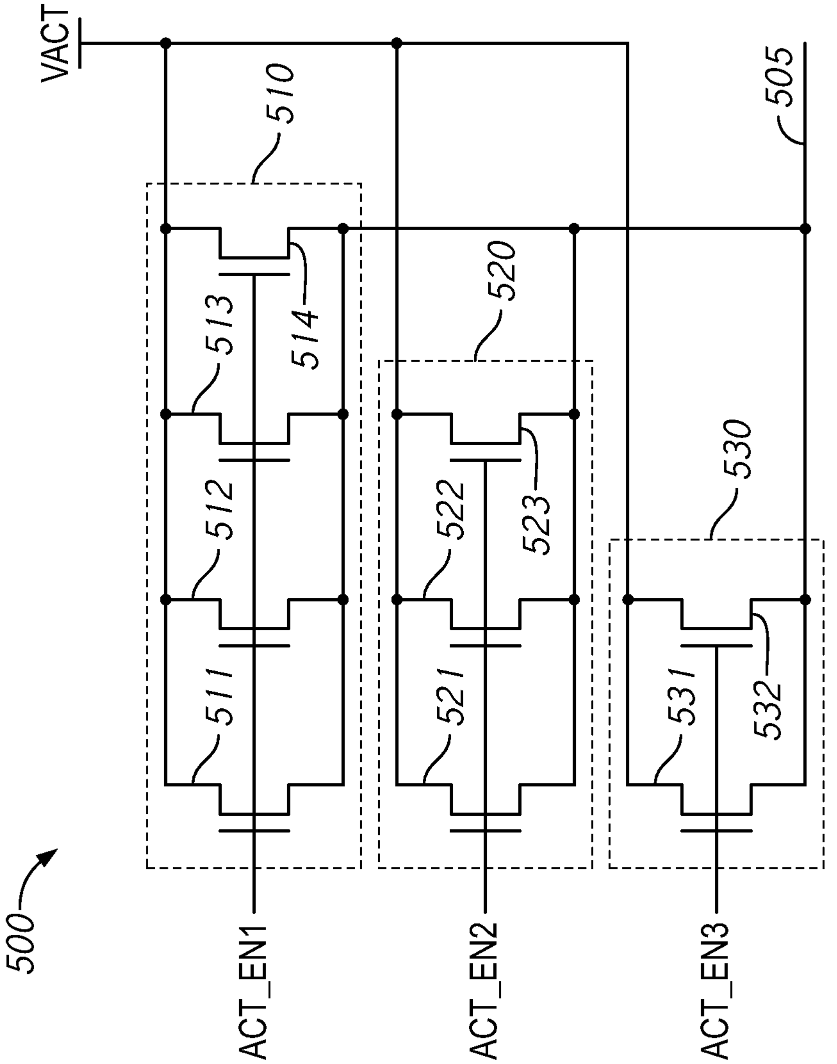
FIG. 5 is a schematic diagram of activation voltage driver circuits according to an embodiment of the disclosure.

FIG. 5 is a schematic diagram of activation voltage driver circuits 500 according to an embodiment of the disclosure. In some embodiments, the activation voltage driver circuits 500 may be included in the ACT driver circuits 235.

The activation voltage driver circuits 500 provide a high level activation voltage (e.g., equal to or greater than 1.0 volts) to sense amplifiers, for example, that are in SA regions during a memory access operation. The activation voltage driver circuits 500 include ACT driver circuits 510, 520, and 530. The ACT driver circuits 510, 520, and 530 are provided an activation supply voltage VACT. Each of the ACT driver circuits receives a respective enable signal. For example, the ACT driver circuit 510 receives the enable signal ACT_EN1, the ACT driver circuit 520 receives the enable signal ACT_EN2, and the ACT driver circuit 530 receives the enable signal ACT_EN3. The enable signals ACT_EN1, ACT_EN2, and ACT_EN3 may be provided by an internal control circuit that provides control signals to perform memory operations. When activated, each of the ACT driver circuits 510, 520, and 530 provides the activation supply voltage VACT to the activation voltage supply node 505.

The ACT driver circuit 510 includes transistors 511-514 that are coupled in parallel to receive the activation supply voltage VACT and are further coupled to the activation voltage supply node 505. When the enable signal ACT_EN1 is active (e.g., active high logic level), the transistors 511-514 are activated to provide the activation supply voltage VACT to the activation voltage supply node 505. The ACT driver circuit 520 includes transistors 521-523 coupled in parallel to receive the activation supply voltage VACT and are further coupled to the activation voltage supply node 505. When the enable signal ACT_EN2 is active (e.g., active high logic level), the transistors 521-523 are activated to provide the activation supply voltage VACT to the activation voltage supply node 505. The ACT driver circuit 530 includes transistors 531 and 532 coupled in parallel to receive the activation supply voltage VACT and are further coupled to the activation voltage supply node 505. When the enable signal ACT_EN3 is active (e.g., active high logic level), the transistors 531 and 532 are activated to provide the activation supply voltage VACT to the activation voltage supply node 505.

Each of the ACT driver circuits 510, 520, and 530 may provide the activation supply voltage VACT with a different current drive. For example, the ACT driver circuit 510 may provide the activation supply voltage VACT with greater current drive than the ACT driver circuit 520 when activated, and the ACT driver circuit 520 may provide the activation supply voltage VACT with greater current drive than the ACT driver circuit 530. In some embodiments of the disclosure, the ACT driver circuits 510, 520, and 530 may be activated at different times. In some embodiments of the disclosure, activating the ACT driver circuits 510, 520, and 530 at different times may result in two or more of the ACT driver circuits 510, 520, and 530 having overlapping activation.

Figure 6:
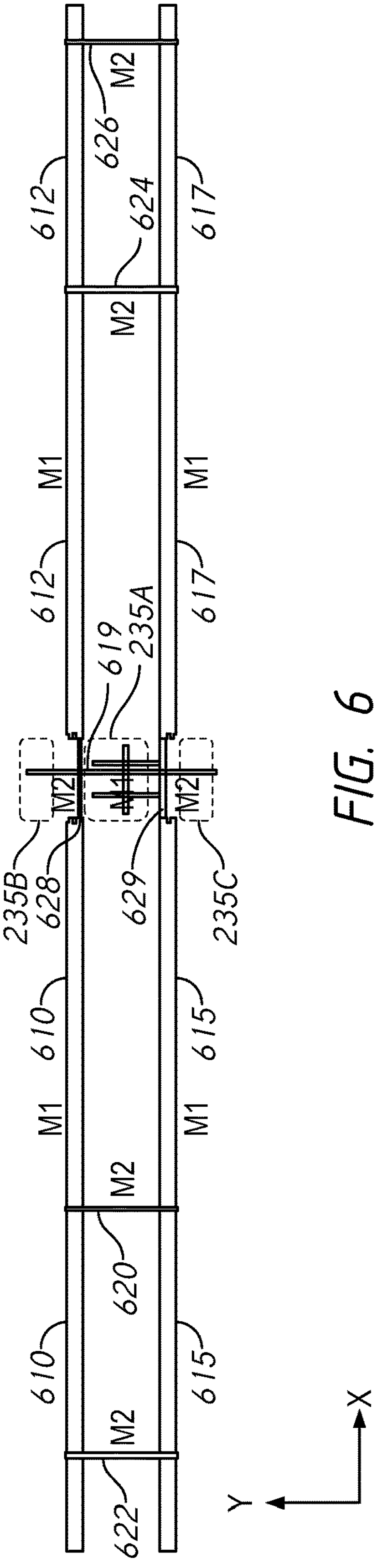
FIG. 6 is a diagram of a conductive supply voltage mesh according to an embodiment of the disclosure.

FIG. 6 is a diagram of a conductive activation voltage mesh 600 according to an embodiment of the disclosure. In some embodiments of the disclosure, the activation voltage mesh 600 may be included in gap regions between memory mats to provide an activation supply voltage (e.g., activation VACT) from activation voltage driver circuits to circuits included in the gap regions. For example, with reference to FIGS. 2 and 6, in some embodiments of the disclosure, the conductive activation voltage mesh 600 may be included in the portion 200 of the gap regions to provide the activation supply voltage VACT from ACT driver circuits 235A-235C in the minigap region 230 to sense amplifiers in the sense amplifier gap regions 210L and 210R.

The conductive activation voltage mesh 600 includes conductive lines 610-619 and conductive lines 620-629. The conductive lines 610-617 extend along a direction X in sense amplifier gap regions, for example, sense amplifier gap regions 210L and 210R. The conductive line 619 extends along a direction Y in a minigap region, for example, minigap region 230. The conductive lines 620-626 extend along a direction Y in the sense amplifier gap regions (e.g., sense amplifier gap regions 210L and 210R) and generally in the same direction the minigap region extends, for example, minigap region 230. The conductive lines 620 and 622 extend along the direction Y across the read-write gap region 220L and the conductive lines 624 and 626 extend along the direction Y across the read-write gap region 220R. The conductive lines 628 and 629 extend along a direction X in the minigap region, such as minigap region 230.

The conductive lines 610-619 and 620-629 of the conductive activation voltage mesh 600 are coupled to one another. For example, the conductive lines 610 and 612 are coupled by a conductive line 628 that extends across a minigap region, and the conductive lines 615 and 617 are coupled by a conductive line 629 that extends across the minigap region. The conductive line 619 is coupled to the conductive lines as well. The conductive lines 610 and 615 are coupled to conductive lines 620 and 622, and the conductive lines 612 and 617 are coupled to conductive lines 624 and 626. The resulting conductive activation voltage mesh 600 is electrically continuous over the conductive lines 610-619 and 620-629.

The conductive lines 619, 628, and 629 are coupled to activation voltage drivers also included in a minigap region. For example, the conductive lines 619, 628, and 629 are coupled to the ACT voltage drivers 235A-235C. As a result, the activation voltage provided by the ACT voltage drivers 235 may be provided over the conductive activation voltage mesh 600 to circuits in the gap regions that are coupled to the conductive activation voltage mesh 600. For example, in some embodiments, the conductive activation voltage mesh 600 provides the activation voltage to sense amplifiers included in the sense amplifier gap regions 210L and 210R.

In some embodiments, the conductive lines 610-619 may be from different conductive layers than the conductive lines 620-629. For example, in some embodiments, conductive lines 610-619 are from a conductive layer Metal 1 and conductive lines 620-629 are from a conductive layer Metal 2. The conductive layer Metal 2 is above the conductive layer Metal 1, with a non-conductive layer between the conductive layers Metal 1 and Metal 2. Conductive lines from conductive layer Metal 2 may be coupled to conductive lines from conductive layer Metal 1 through conductive vias. For example, the conductive line 620 of conductive layer Metal 2 is coupled to the conductive lines 610 and 615 of conductive layer Metal 1 through conductive vias that extend through the non-conductive layer from the conductive line 620 to the conductive lines 610 and 615. The conductive line 622 of conductive layer Metal 2 is similarly coupled to the conductive lines 610 and 615. The conductive line 624 of conductive layer Metal 2 is coupled to the conductive lines 612 and 617 of conductive layer Metal 1 through conductive vias that extend through the non-conductive layer from the conductive line 624 to the conductive lines 612 and 617. The conductive line 626 of conductive layer Metal 2 is similarly coupled to the conductive lines 612 and 617. In some embodiments, the conductive layers Metal 1 and Metal 2 include tungsten, copper, aluminum, or combinations of the conductive materials.

The structure of the conductive activation voltage mesh 600 includes conductive lines to deliver the activation supply voltage VACT from the minigap region 230 to the sense amplifier gap regions 210L and 210R. The read-write gap regions of the sense amplifier gap regions may have at least a portion between conductive lines of the conductive activation voltage mesh 600. For example, in some embodiments, the read-write gap region 220L has at least a portion that is between conductive lines 610 and 615, and the read-write gap region 220R has at least a portion that is between conductive lines 612 and 617. The conductive lines 620 and 622 extend across the read-write gap region 220L, and the conductive lines 624 and 626 extend across the read-write gap region 220R.

Figure 7:
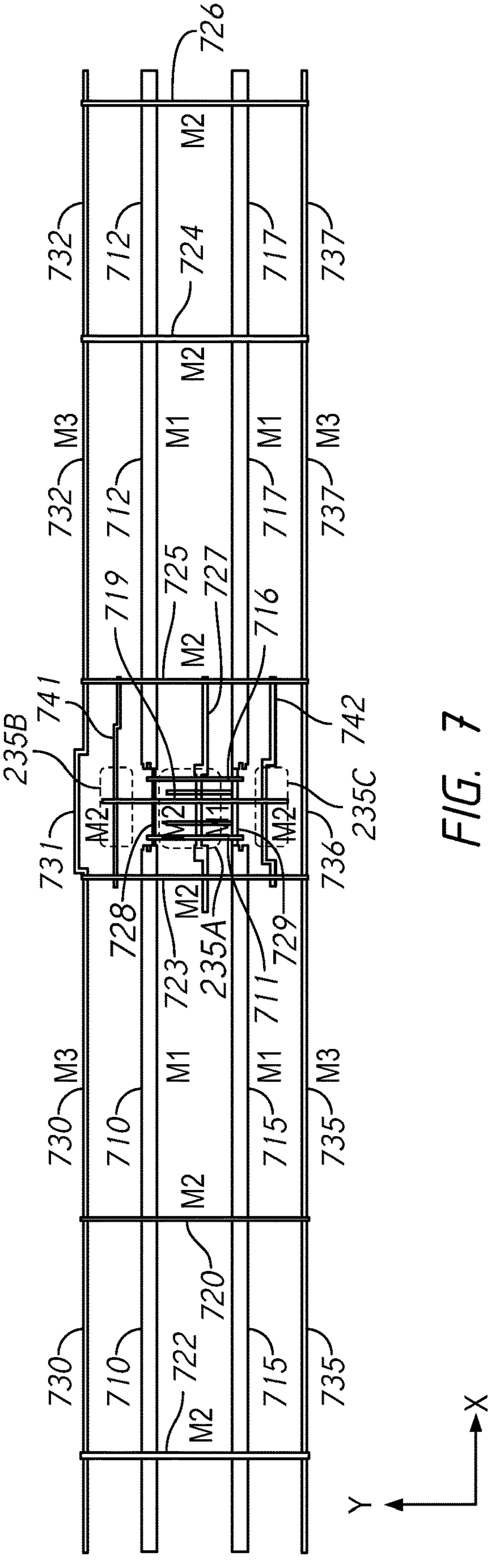
FIG. 7 is a diagram of a conductive supply voltage mesh according to an embodiment of the disclosure.

FIG. 7 is a diagram of a conductive activation voltage mesh 700 according to an embodiment of the disclosure. In some embodiments of the disclosure, the activation voltage mesh 700 may be included in gap regions between memory mats to provide an activation supply voltage (e.g., activation VACT) from activation voltage driver circuits to circuits included in the gap regions. For example, with reference to FIGS. 2 and 7, in some embodiments of the disclosure, the conductive activation voltage mesh 700 may be included in the portion 200 of the gap regions to provide the activation supply voltage VACT from ACT driver circuits 235A-235C in the minigap region 230 to sense amplifiers in the sense amplifier gap regions 210L and 210R.

The conductive activation voltage mesh 700 includes conductive lines 710-719, conductive lines 720-729, 741, and 742 and conductive lines 730-737. The conductive lines 710, 712, 715, and 717 extend along a direction X in sense amplifier gap regions, for example, sense amplifier gap regions 210L and 210R. The conductive lines 711, 716, and 719 extend along a direction Y in a minigap region, for example, minigap region 230. The conductive lines 720-726 extend along a direction Y in the sense amplifier gap regions (e.g., sense amplifier gap regions 210L and 210R) and generally in the same direction the minigap region extends, for example, minigap region 230. The conductive lines 720, 722, and 723 extend along the direction Y across the read-write gap region 220L, and the conductive lines 724, 725, and 726 extend along the direction Y across the read-write gap region 220R. The conductive lines 727-729, 741, and 742 extend along a direction X in the minigap region, such as minigap region 230. The conductive lines 730, 732, 735, and 737 extend along a direction X in sense amplifier gap regions, for example, sense amplifier gap regions 210L and 210R. The conductive lines 731 and 736 extend along the direction X in a minigap region, for example, minigap region 230.

The conductive lines 710-719, 720-729, 741, 742, and 730-737 of the conductive activation voltage mesh 700 are coupled to one another. For example, the conductive lines 710 and 712 are coupled by the conductive line 728 that extends across a minigap region, and the conductive lines 715 and 717 are coupled by the conductive line 729 that extends across the minigap region. The conductive lines 730 and 732 are coupled to conductive line 731 that extends across the minigap region, and the conductive lines 735 and 737 are coupled by the conductive line 736 that extends across the minigap region. The conductive lines 710, 730, 715, and 735 are coupled to conductive lines 720, 722, and 723, and the conductive lines 712, 732, 717, and 737 are coupled to conductive lines 724, 725, and 726. The conductive lines 727-729, 741, 742 are coupled to conductive lines 711, 716, 719, 723, and 725. The resulting conductive activation voltage mesh 700 is electrically continuous over the conductive lines 710-719, 720-729, 741, 742, and 730-737.

The conductive lines 711, 716, 719 and 727-729, 741, 742 are coupled to activation voltage drivers also included in a minigap region. For example, the conductive lines 719 and 727-729 are coupled to the ACT voltage drivers 235A-235C. As a result, the activation voltage provided by the ACT voltage drivers 235 may be provided over the conductive activation voltage mesh 700 to circuits in the gap regions that are coupled to the conductive activation voltage mesh 700. For example, in some embodiments, the conductive activation voltage mesh 700 provides the activation voltage to sense amplifiers included in the sense amplifier gap regions 210L and 210R.

In some embodiments, the conductive lines 710-719, 727-729, 741, 742, and 730-737 may be from different conductive layers. For example, in some embodiments, conductive lines 710-719 are from a conductive layer Metal 1 and conductive lines 720-729, 741, and 742 are from a conductive layer Metal 2. The conductive lines 730-737 are from a conductive layer Metal 3. The conductive layer Metal 2 is above the conductive layer Metal 1, and the conductive layer Metal 3 is above the conductive layer Metal 2. A non-conductive layer is between the conductive layers Metal 1 and Metal 2, and another non-conductive layer is between the conductive layers Metal 2 and Metal 3. Conductive lines from conductive layer Metal 2 may be coupled to conductive lines from conductive layer Metal 1 through conductive vias. Similarly, conductive lines from conductive layer Metal 3 may be coupled to conductive lines from conductive layers Metal 1 and/or Metal 2. For example, the conductive line 720 of conductive layer Metal 2 is coupled to the conductive lines 710 and 715 of conductive layer Metal 1 and coupled to conductive lines 730 and 735 of conductive layer Metal 3 through conductive vias that extend through the non-conductive layers from the conductive line 720 to the conductive lines 710 and 715, and to the conductive lines 730 and 735. The conductive lines 722 and 723 of conductive layer Metal 2 are similarly coupled to the conductive lines 710 and 715, and to the conductive lines 730 and 735. The conductive line 724 of conductive layer Metal 2 is coupled to the conductive lines 712 and 717 of conductive layer Metal 1 and coupled to conductive lines 732 and 737 of conductive layer Metal 3 through conductive vias that extend through the non-conductive layers from the conductive line 724 to the conductive lines 712 and 717, and to the conductive lines 732 and 737. The conductive lines 725 and 726 of conductive layer Metal 2 are similarly coupled to the conductive lines 712 and 717, and to the conductive lines 732 and 737. In some embodiments, the conductive layers Metal 1, Metal 2, and Metal 3 include tungsten, copper, aluminum, or combinations of the conductive materials.

The structure of the conductive activation voltage mesh 700 includes conductive lines to deliver the activation supply voltage VACT from the minigap region 230 to the sense amplifier gap regions 210L and 210R. The read-write gap regions of the sense amplifier gap regions may have at least a portion that is between conductive lines of the conductive activation voltage mesh 700. For example, in some embodiments, the read-write gap region 220L has at least a portion that is between conductive lines 710 and 715, and the read-write gap region 220R has at least a portion that is between conductive lines 712 and 717. The SA regions of the sense amplifier gap regions may also have at least a portion that is between conductive lines of the conductive activation voltage mesh. For example, in some embodiments, one of the SA regions 215L has at least a portion that is between the conductive lines 710 and 730, and the other SA region 215L has at least a portion that is between the conductive lines 715 and 735. Similarly, one of the SA regions 215R has at least a portion that is between the conductive lines 712 and 732, and the other SA region 215R has at least a portion that is between the conductive lines 717 and 737. The conductive lines 720, 722, and 723 extend across the read-write gap region 220L and the SA regions 215L, and the conductive lines 724, 725, and 726 extend across the read-write gap region 220R and the SA regions 215R.

The conductive activation voltage mesh 700 has lower resistance compared to the conductive activation voltage mesh 600. As a result, an activation voltage may be provided on the conductive activation voltage mesh 700 with less voltage drop over the length of the conductive lines from the minigap region where activation voltage drivers may be included. In comparison to the conductive activation voltage mesh 600, the conductive activation voltage mesh 700 includes additional conductive lines (e.g., conductive lines 730, 732, 735, and 737) that extend through the sense amplifier gap regions and carry an activation voltage from the minigap region to the sense amplifier gap regions in addition to the conductive lines 710, 715, 712, and 717.

Although various embodiments of the disclosure have been disclosed, it will be understood by those skilled in the art that the embodiments extend beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
first and second memory mats;
sense amplifiers included in a first gap region between the first and second memory mats;
a local input/output (LIO) line included in the first gap region;
a LIO driver and a LIO precharge circuit coupled to the LIO line and included in the first gap region; and
an activation voltage driver circuit included in a second gap region, the second gap region including a boundary shared with the first gap region, and including a first corner at a corner of the first memory mat and further including a second corner at a corner of the second memory mat, the activation voltage driver circuit configured to provide an activation voltage to the sense amplifiers.

2. The apparatus of claim 1 wherein the LIO driver and the LIO precharge circuit are included in a read-write gap region of the first gap region, and wherein the sense amplifiers are included in a sense amplifier region of the first gap region.

3. The apparatus of claim 1, further comprising a second activation voltage driver included in the first gap region, the second activation voltage driver configured to provide a second activation voltage to the sense amplifiers.

4. The apparatus of claim 1, further comprising:
third and fourth memory mats;
second sense amplifiers in a third gap region between the third and fourth memory mats;
a second LIO line included in the third gap region; and
a second LIO driver and a second LIO precharge circuit coupled to the second LIO line and included in the third gap region,
wherein the activation voltage driver circuit is configured to provide the activation voltage to the second sense amplifiers, and the second gap region includes a second boundary shared with the third gap region, and includes a third corner at a corner of the third memory mat and further includes a fourth corner at a corner of the fourth memory mat.

5. The apparatus of claim 4, further comprising a conductive activation voltage mesh coupled to the activation voltage driver circuit and coupled to the sense amplifiers and second sense amplifiers to provide the activation voltage thereto.

6. The apparatus of claim 5 wherein the conductive activation voltage mesh includes conductive lines in the first and third gap regions, the conductive lines including first conductive lines from a first metal layer and second conductive lines from a second metal layer.

7. The apparatus of claim 6 wherein the conductive lines of the conductive activation voltage mesh further includes third conductive lines from a third metal layer.

8. An apparatus, comprising:
first and second memory mats adjacent along a first direction, the first and second memory mats including memory cells;
a region between the first and second memory mats along the first direction, the region including a local input/output (LIO) line that extends along a second direction perpendicular to the first direction through the region, and further including a LIO driver and a LIO precharge circuit coupled to the LIO line, the LIO driver configured to drive the LIO line to data voltage levels based on data read from the memory cells or based on data to be written to the memory cells, and the LIO precharge circuit configured to provide a LIO precharge voltage to the LIO lines; and
a second region adjacent the region in the second direction, the second region including a first activation voltage driver circuit configured to provide a first activation voltage to sense amplifiers included in the region between the first and second memory mats along the first direction.

9. The apparatus of claim 8 wherein the region between the first and second memory mats along the first direction includes a second activation voltage driver circuit, the second activation voltage driver circuit configured to provide a second activation voltage different than the first activation voltage to the sense amplifiers included in the region between the first and second memory mats along the first direction.

10. The apparatus of claim 8, wherein the second region further includes a second activation voltage driver circuit, the second activation voltage driver circuit configured to provide the first activation voltage to the sense amplifiers included in the region between the first and second memory mats along the first direction, the second activation voltage driver circuit having a different current drive than the first activation voltage driver circuit.

11. An apparatus, comprising:
first and second memory mats adjacent along a first direction, the first and second memory mats including memory cells;
a region between the first and second memory mats along the first direction, the region including a local input/output (LIO) line that extends along a second direction perpendicular to the first direction through the region, and further including a LIO driver and a LIO precharge circuit coupled to the LIO line, the LIO driver configured to drive the LIO line to data voltage levels based on data read from the memory cells or based on data to be written to the memory cells, and the LIO precharge circuit configured to provide a LIO precharge voltage to the LIO lines; and
a conductive activation voltage mesh including conductive lines that extend in the second direction in the region, the conductive activation voltage mesh configured to provide an activation voltage to circuits included in the region.

12. The apparatus of claim 11 wherein the conductive lines of the conductive activation voltage mesh comprises first and second conductive lines that extend in the second direction in the region, and at least a portion of a sense amplifier region including sense amplifiers is between the first and second conductive lines.

13. The apparatus of claim 12 wherein the first conductive line is from a first conductive layer and the second conductive line is from a different conductive layer than the first conductive layer.

14. The apparatus of claim 11 wherein the conductive lines of the conductive activation voltage mesh comprises first and second conductive lines that extend in the second direction in the region, and at least a portion of a read-write gap region including the LIO driver and the LIO precharge circuit is between the first and second conductive lines.

15. The apparatus of claim 14 wherein the conductive activation voltage mesh further includes conductive lines in the region coupled to first and second conductive lines and extend across the read-write gap region along the first direction.

16. An apparatus, comprising:

first and second memory mats adjacent along a first direction, the first and second memory mats including memory cells;

a first region between the first and second memory mats and including sense amplifiers coupled to the memory cells, and further including a local/input output (LIO) line, a LIO driver, and a LIO precharge circuit;

a second region adjacent the first region and including activation voltage driver circuits configured to provide an activation voltage; and a conductive activation voltage mesh coupled to the activation voltage driver circuit and the sense amplifiers to provide the activation voltage from the activation voltage driver circuit in the second region to the sense amplifiers in the first region, the conductive activation voltage mesh including conductive lines extending along a second direction perpendicular to the first direction in the first region.

17. The apparatus of claim 16 wherein the first region comprises a read-write gap region including the LIO driver and the LIO precharge circuit, and the read-write gap region has at least a portion that is between first and second conductive lines of the conductive activation voltage mesh that extend in the first region.

18. The apparatus of claim 17 wherein the first region further comprises a sense amplifier region including the sense amplifiers and the sense amplifier region has at least a portion that is between the first conductive line and a third conductive line of the conductive activation voltage mesh that extends in the first region.

19. The apparatus of claim 17 wherein the first region further comprises a first sense amplifier region including a first portion of the sense amplifiers and a second sense amplifier region including a second portion of the sense amplifiers, the read-write gap region between the first and second sense amplifier regions.

20. The apparatus of claim 16, further comprising a second activation voltage driver included in the second region that is coupled to conductive activation voltage mesh, the second activation voltage driver configured to provide the activation voltage with a current drive different than the activation voltage driver.

* * * * *